US012283807B2

(12) United States Patent
Weis

(10) Patent No.: US 12,283,807 B2
(45) Date of Patent: Apr. 22, 2025

(54) BIDIRECTIONAL ELECTRONIC CIRCUIT BREAKER

(71) Applicant: Innomotics GmbH, Nuremberg (DE)

(72) Inventor: Benno Weis, Hemhofen (DE)

(73) Assignee: Innomotics GmbH, Nuremberg (DE)

( * ) Notice: Subject to any disclaimer, the term of this patent is extended or adjusted under 35 U.S.C. 154(b) by 325 days.

(21) Appl. No.: 17/763,390

(22) PCT Filed: Aug. 17, 2020

(86) PCT No.: PCT/EP2020/072969
§ 371 (c)(1),
(2) Date: Mar. 24, 2022

(87) PCT Pub. No.: WO2021/058197
PCT Pub. Date: Apr. 1, 2021

(65) Prior Publication Data
US 2022/0344927 A1 Oct. 27, 2022

(30) Foreign Application Priority Data
Sep. 27, 2019 (EP) .................................. 19200185

(51) Int. Cl.
*H02H 3/16* (2006.01)
*H02H 1/00* (2006.01)
(52) U.S. Cl.
CPC ............ *H02H 3/16* (2013.01); *H02H 1/0007* (2013.01)
(58) Field of Classification Search
CPC ........ H02H 1/0007; H02H 3/16; H02H 3/325; H02H 3/087; H02H 3/202; H02H 7/262;
(Continued)

(56) References Cited

U.S. PATENT DOCUMENTS 9,853,451 B2 * 12/2017 Tenca ...................... H02J 1/10
11,437,807 B2 * 9/2022 Schierling ............. H02H 5/047
(Continued)

FOREIGN PATENT DOCUMENTS

EP 2517351 B1 2/2015
EP 3 0516 46 A1 8/2016
(Continued)

OTHER PUBLICATIONS

PCT International Search Report and Written Opinion of International Searching Authority mailed Oct. 30, 2020 May 20, 2020 corresponding to PCT International Application No. PCT/EP2020/072969 filed Aug. 17, 2020.

*Primary Examiner* — Jared Fureman
*Assistant Examiner* — Nicolas Bellido
(74) *Attorney, Agent, or Firm* — Henry Feiereisen, LLC

(57) ABSTRACT

An electronic protection switch includes first and second network terminals and two semiconductor switches of same kind. Each semiconductor switch is formed by an IGBT semiconductor switch and includes a switching element and a diode which is arranged antiparallel to the switching element. A first of the two semiconductor switches is arranged without a semiconductor series connection between a positive potential terminal of the first network terminal and a positive potential terminal of the second network terminal. A second of the two semiconductor switches is arranged without a semiconductor series connection between a negative potential terminal of the first network terminal and a negative potential terminal of the second network terminal. The switching element of each semiconductor switch is arranged so as to be able to conduct and switch off a current from the first network terminal to the second network terminal.

12 Claims, 2 Drawing Sheets

(58) Field of Classification Search
CPC .................. H02H 7/267; H02H 7/268; H03K 2217/0009; H03K 17/0828; H03K 17/08; H03K 17/66; H02J 1/10
See application file for complete search history.

(56) References Cited

U.S. PATENT DOCUMENTS

| | | | |
|---|---|---|---|
| 2012/0249023 A1 | 10/2012 | Rottmerhusen | |
| 2016/0226251 A1 | 8/2016 | Tenca et al. | |
| 2017/0302068 A1 | 10/2017 | Kubouchi et al. | |
| 2019/0334340 A1* | 10/2019 | Niehoff | H02H 3/087 |
| 2020/0106259 A1* | 4/2020 | Telefus | H02H 5/04 |
| 2020/0106260 A1* | 4/2020 | Telefus | H03K 17/687 |
| 2020/0136604 A1 | 4/2020 | Schierling et al. | |
| 2021/0203227 A1* | 7/2021 | Li | H02M 1/0095 |
| 2022/0045503 A1* | 2/2022 | Schierling | H03K 17/0828 |
| 2022/0123745 A1* | 4/2022 | Cairoli | H03K 17/76 |

FOREIGN PATENT DOCUMENTS

| | | |
|---|---|---|
| EP | 3 379 725 A1 | 9/2018 |
| WO | WO 2014-044297 A1 | 3/2014 |

* cited by examiner

BIDIRECTIONAL ELECTRONIC CIRCUIT BREAKER

CROSS-REFERENCES TO RELATED APPLICATIONS

This application is the U.S. National Stage of International Application No. PCT/EP2020/072969, filed Aug. 17, 2020, which designated the United States and has been published as International Publication No. WO 2021/058197 A1 and which claims the priority of European Patent Application, Serial No. 19200185.7, filed Sep. 27, 2019, pursuant to 35 U.S.C. 119 (a)-(d).

BACKGROUND OF THE INVENTION

The invention relates to an electronic protection switch, which has two semiconductor switches, each with a switching element and a diode arranged antiparallel to the switching element. The invention furthermore relates to an energy network with a first and a second energy subnetwork as well as an electronic protection switch of this kind for disconnecting the first energy subnetwork from the second energy subnetwork. The invention further relates to a method for operating an energy network of this kind.

Nowadays, mechanical and electronic switches are used to switch currents. In mechanical switches, the contact between the two terminals of the switch is established or interrupted in a mechanical manner. These are especially suitable for the switching of alternating voltage current, because they can be produced at a reasonable cost and the switching operation can also be implemented in a simple manner due to the zero crossing of the current. For the switching of direct currents, mechanical switches become considerably more complex, as an arcing that occurs complicates the switching behavior. Nowadays, electronic switches are often used here. These use one or more semiconductor switches that can be switched off as the switching element. These semiconductor switches have the advantage of also being able to switch a direct current without arcing and therefore in a simple manner. However, these electronic switches have forward losses. On the other hand, an electronic switch has the advantage of its rapid switching capacity and a high number of possible switching operations. This leads to a long service life of the electronic switch.

An electronic switch, also referred to as DC switch, is known from EP 3 379 725 A1. The document describes a method for controlling a DC switch of this kind, wherein the DC switch has a first semiconductor switch that can be switched off and a second semiconductor switch that can be switched off, wherein the first and the second semiconductor switches that can be switched off are arranged between a first terminal and a second terminal such that a current with a first polarity can be conducted through the first semiconductor switch that can be switched off and the current with a polarity that is opposite to the first polarity can be conducted through the second semiconductor switch that can be switched off, wherein one of the semiconductor switches that can be switched off is switched off as a function of a current measurement value.

As the semiconductor switches used for the most part are only able to switch off the current in one current direction, often at least two semiconductor switches are used in an electronic switch. In this context, the semiconductors have a switching element that is able to switch a current on and off in one direction. The current in the other direction is guided past the switching element by a diode arranged parallel to the switching element. It is said that the diode is arranged antiparallel to the switching element. This makes it possible, through the use of two semiconductor switches arranged in series between the terminals of the electronic switch, to switch, in particular switch off, a current through the electronic switch in both current directions. This arrangement of the semiconductor switches takes place antiserially to one another. This means that a first semiconductor switch is able to switch off a current with the first polarity, i.e. in a current direction, and the second switch is able to switch off a current with opposite polarity, i.e. opposite current direction.

For use in a DC voltage network, in which a load is connected to a DC voltage source via lines or conductor rails, also generally referred to as feeds or feed lines, it is sufficient to provide only one of the two feeds with an electronic switch. With this electronic switch it is possible for the energy supply between energy supply network and load to be interrupted in a reliable manner. This is because a current of the same amount, but different polarity, is always flowing via the two feeds between which the DC voltage is applied. Particularly in isolated DC voltage networks, the electronic switch is arranged in only one feed, in order to therefore keep the costs and the losses low. If there is a desire to identify and be in control of a ground fault, as well as locate it, however, then a corresponding electronic switch is arranged in both feeds. By measuring the voltage over the two electronic switches in the respective feeds, it is possible to obtain sufficient information, with which it is possible to identify and locate a ground fault.

An energy network is understood to mean a network of energy sources and/or electrical consumers which are interconnected. These may be subdivided into individual energy subnetworks. In this context, the energy network has a DC or AC voltage for transferring electrical energy.

The object underlying the invention is to improve an electronic switch for a DC voltage network.

SUMMARY OF THE INVENTION

This object is achieved by an electronic protection switch, having two semiconductor switches, each with a switching element and a diode arranged antiparallel to the switching element, and further having a first network terminal and a second network terminal, each with a positive potential terminal and a negative potential terminal, wherein a first of the semiconductor switches is arranged without a semiconductor series connection between the positive potential terminal of the first network terminal and the positive potential terminal of the second network terminal and a second of the semiconductor switches is arranged without a semiconductor series connection between the negative potential terminal of the first network terminal and the negative potential terminal of the second network terminal, wherein the switching element of the respective semiconductor switch is arranged so as to be able to conduct and switch off a current from the first network terminal to the second network terminal. This object is furthermore achieved by an energy network, in particular a DC voltage network, with a first energy subnetwork and a second energy subnetwork, wherein the energy network has an electronic protection switch of this kind for disconnecting the first energy subnetwork and the second energy subnetwork from one another, wherein the first energy subnetwork is connected to the first network terminal and the second energy subnetwork is connected to the second network terminal. This object is furthermore achieved by a method for operating an energy network of this kind, wherein the electronic protection switch is opened when a ground fault occurs in the energy network.

Further advantageous embodiments of the invention are specified in the dependent claims.

The invention is based on the knowledge that an electronic switch that is suitable for protecting from damage during the occurrence of a fault, in particular during the occurrence of a ground fault, in an energy network, in particular in a DC voltage network, can be improved by a modified arrangement of the semiconductor switches compared to a known electronic switch. To this end, the two semiconductor switches present in an antiserial manner of a known electronic switch are now arranged in a distributed manner in the different feeds between an energy supply network, an energy source or generally a first energy subnetwork, and a load, consumer or generally a second energy subnetwork. As a result, the connections between the first network terminal and the second network terminal then no longer have a series connection of semiconductor switches. As there is no longer any series connection of semiconductors between the first and the second network terminal, this arrangement is also referred to as being "without a semiconductor series connection". In this context, the two energy subnetworks may each have any number of energy sources and/or loads, such as electrical consumers for example.

The semiconductor switch has a switching element and a diode. In this context, the diode is arranged antiparallel to the switching element. While the switching element is able to conduct and guide a current in one current direction, the diode is only able to conduct a current in the opposite direction but cannot switch it.

Two semiconductor switches of the same kind is understood to mean the semiconductor switches having the same design. Thus, for example, bipolar transistors and field-effect transistors have a different design. In this context, a distinction is also made between the individual semiconductor switches according to the types NPN or PNP or according to the types with P channel or N channel. Thus, two semiconductor switches of the same kind are defined in that they are of an identical type.

As the electronic switch is provided for protecting from a fault or the effects of the fault in the energy network, it is also referred to as an electronic protection switch. In the antiparallel arrangement, the semiconductor switch is arranged so as to be able to conduct and switch off a current from the first network terminal to the second network terminal, and the diode of the respective semiconductor switch is arranged so as to be able to conduct a current from the second network terminal to the first network terminal. In this context, the switching element of the respective semiconductor switch is arranged between the first and second network terminal such that a current in the individual potential terminals flows from the first to the second network terminal through the switching element, and a current flows in the opposite direction, i.e. from the second to the first network terminal through the diode arranged antiparallel to the switching element. It is also possible for the switching element of the respective semiconductor switch to be arranged between the first and second network terminal such that a current in the individual potential terminals flows from the second to the first network terminal through the switching element, and a current flows in the opposite direction, i.e. from the first to the second network terminal through the diode arranged antiparallel to the switching element.

Due to the arrangement in different feeds, it is possible to disconnect the connection between the energy supply network and the load and therefore also the energy exchange between energy supply network and load, even if only one switching element is present in the respective feed, as a current of the same amount, but in a different direction, is flowing through the feeds in each case. The sum of the currents in one direction is equal to the sum of the currents in the other direction, which are distributed over the different feeds. In this context, the semiconductors are arranged in the respective feeds such that they are able to switch off this current in one direction, in particular from the first network terminal to the second network terminal. The connection and the energy exchange between the energy subnetworks, for example an energy source and a load, can therefore be interrupted. The electronic protection switch thus has a total of at least four terminals, at least two in the form of first network terminals for connecting to a first energy subnetwork, such as an energy source for example, and at least two further terminals in the form of second network terminals for connecting to a second energy subnetwork, for example a load.

In a DC voltage network, the electronic protection switch advantageously has precisely two potential terminals as first network terminal and precisely two potential terminals as second network terminal, as for these applications precisely two feeds are present between energy source and load, between which the supply voltage, the DC voltage, is applied. The two potential terminals of the respective network terminals are then provided, in this DC voltage network, to be connected on the one hand to the positive potential of the load or the energy source and to the negative potential of the energy source or the load. In general, instead of an energy source and a load, this may involve a first energy subnetwork, i.e. a first DC voltage subnetwork, and a second energy subnetwork, i.e. a second DC voltage subnetwork. For this reason, these potential terminals are in each case also referred to as positive potential terminal or negative potential terminal. In fault-free operation, the current through the two feeds has the same amount but differs in its sign. In other words, the current has a different polarity in the two feeds. In this context, there is a forward current and return current between the energy source and the load.

In general, an electronic protection switch of this kind is likewise suitable for use in a single-phase AC voltage network. This also has two feeds, over which the semiconductor switches can be distributed. The electronic protection switch then also has two potential terminals per network terminal, wherein for example the positive potential terminal is then connected to the phase and the negative network terminal to the neutral conductor.

Use in a three-phase energy network is also possible. Depending on the embodiment, this then has three or four feeds (three phases and a neutral conductor, if necessary). The electronic protection switch for such a network then has three or four potential terminals. Here too, the switching elements are all arranged between the individual potential terminals of the first and second network terminal so as to be able to conduct and switch off a current from the first network terminal to the second network terminal. Here too, the semiconductors are without a semiconductor series connection, i.e. without the use of a series connection of two semiconductor switches, between the first and the second network terminal. The diodes of the semiconductor switch are also situated antiparallel to the switching element in this arrangement accordingly.

In order to be able to locate a fault, such as a ground fault, it is not possible to arrange an electronic switch in only one feed. Previously, in this case two electronic switches each with two semiconductors have therefore been used for the connection of the energy supply network to the load. In this case, however, due to the forward losses of the individual switches, a total of four times the forward losses are incurred over the respective semiconductor. Due to the proposed electronic protection switch with a total of only two semiconductors, the forward losses can be halved. Likewise, it can be produced at a considerably more reasonable cost, as only half the semiconductors are required and as a result it is possible to save on expensive semiconductor switches.

Due to the arrangement of the semiconductor switches, the first semiconductor switch is able to conduct and interrupt a current from the positive potential terminal of the first network terminal to the positive potential terminal of the second network terminal, and the second semiconductor switch is able to conduct and interrupt a current from the negative potential terminal of the first network terminal to the negative potential terminal of the second network terminal. A current between the two energy subnetworks can therefore be interrupted regardless of the energy flow direction.

In an advantageous embodiment of the invention, the electronic protection switch in each case has a voltage detection for measuring a voltage between the positive potential terminal of the first network terminal and a ground potential and/or a voltage between the negative potential terminal of the first network terminal and the ground potential and/or a voltage between the positive potential terminal of the second network terminal and the ground potential and/or a voltage between the negative potential terminal of the second network terminal and the ground potential.

Compared to an electronic switch that is situated in only one feed, the electronic protection switch with one semiconductor in the respective feeds in each case has the advantage of also being able to gain information regarding the status of the second feed. In a DC voltage network, the two semiconductor switches are distributed over the two feeds in this context. In this context, it is possible to measure the forward voltage of the diodes of different values between the first network terminal and the ground potential and the second network terminal and the ground potential, by means of the respective voltage detection, due to the forward voltage over the corresponding semiconductor switch or in the case of a current flow over the diodes. This information is helpful when identifying and locating faults, such as ground faults for example, in the DC voltage network. In other words, by allocating the semiconductors of the electronic switch from one feed to the two feeds, it is possible to gain a degree of freedom in the measurement, from which it is possible to determine information regarding faults, in particular ground faults in the DC voltage network. In contrast to an arrangement in which only one electronic switch is situated in one of the two feeds, on the occurrence of a current through the semiconductor switch or the diode in the correspondingly other feed, a ground fault can be reliably located on the basis of the potentials of the two terminals of the semiconductor switch that are different due to the forward voltage, compared to the ground potential. At the same time, the electronic protection switch does not have higher losses, as it is designed for use in a DC voltage network by precisely two semiconductor switches in the current path to be switched. As, in the event of a ground fault, precisely one potential of a semiconductor terminal is equal to the ground potential, it is possible for this terminal to be identified as the location of the ground fault from this information.

By locating the ground fault, it is possible to transmit this information to a higher-level or further control or protection device, which then safely switches off the region in which the fault is present. Thus, safe operation is also enabled by the electronic protection switch. The switching off of the region in question may then take place, for example, by means of its associated semiconductor switch or a mechanical switch, which in normal operation generates almost no losses and only has to be designed for a low number of switching operations.

In a further advantageous embodiment of the invention, the two semiconductor switches of the same kind are each formed by an IGBT semiconductor switch. Due to its current-carrying capacity and its blocking capability, the IGBT is especially suitable for the implementation of the proposed protection switch. Its design is based on an NPN-type transistor. Thus, the circuit can have a symmetrical design and behaves in the same manner both for the positive and the negative potential terminal. Moreover, an IGBT responds in a sufficiently rapid manner in order to also be able to disconnect the subnetworks from one another in a sufficiently rapid manner in the event of a ground fault. Furthermore, its blocking capability and overload capability, especially when using inductive loads, is also sufficient to be able to disconnect the networks from one another in a safe manner.

BRIEF DESCRIPTION OF THE DRAWING

The invention is described and explained in more detail below on the basis of the exemplary embodiments shown in the figures, in which.

DETAILED DESCRIPTION OF PREFERRED EMBODIMENTS

Figure 1:
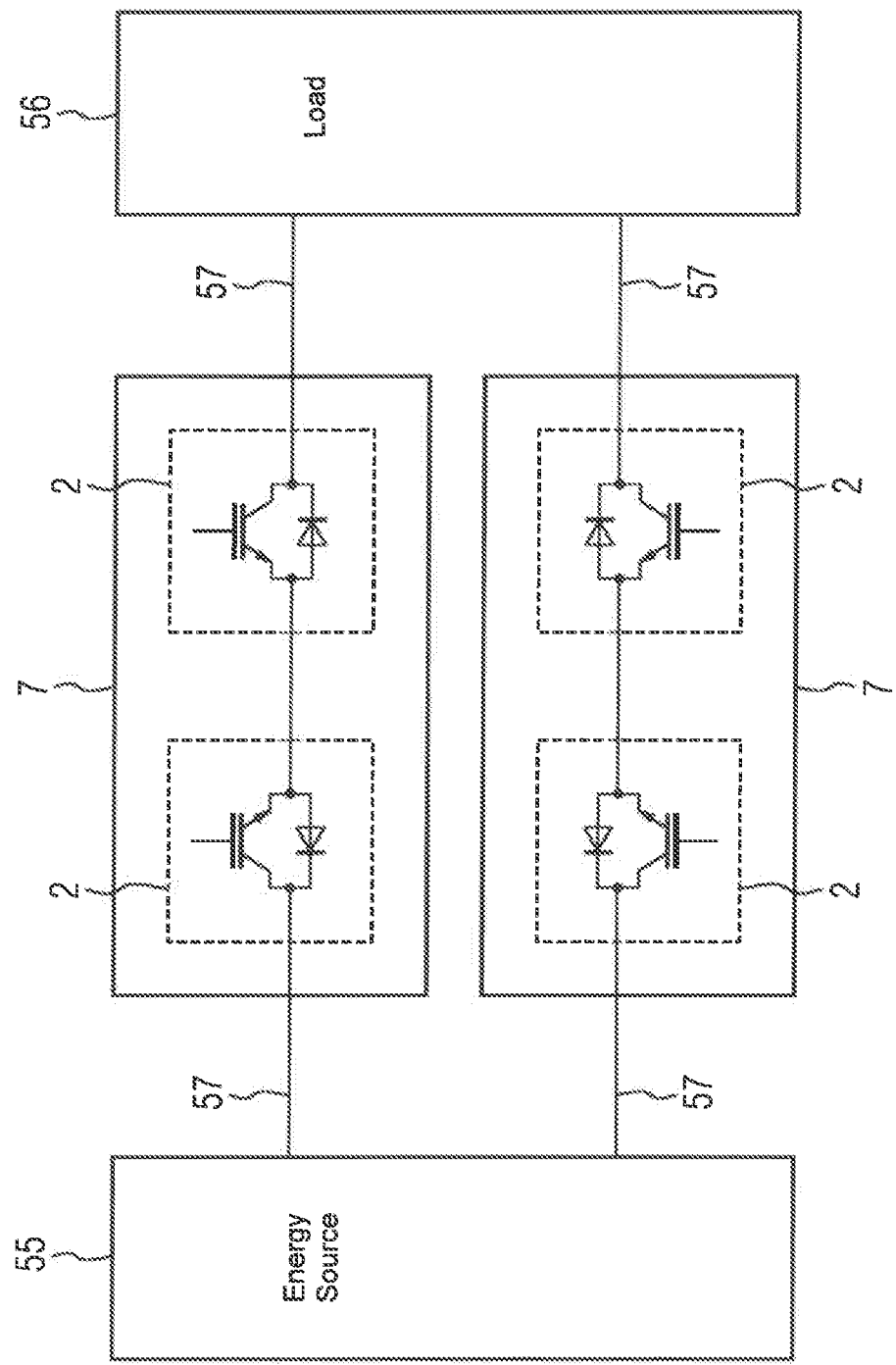
FIG. 1 shows an energy supply of a load via a known electronic switch.

FIG. 1 shows a known arrangement, in which an energy source 55 is connected to a load 56 via two known electronic switches 7. In this context, the electronic switches 7 are arranged in the individual feeds 57, which electrically connect the energy source 55 to the load 56. In this context, a DC voltage network is involved, for example, in which energy source 55 and load 56 are interconnected via two feeds 57, and in which a DC voltage is applied between the two feeds 57. In order to be able to disconnect the load 56 from the energy supply network 56, an electronic switch 7 is present in each of the two feeds 57 in each case. By way of the electronic switch 7 in both feeds 57, a current can only be reliably switched off in one of the two feeds 57, as may occur in a ground fault for example.

The electronic switch 7 has a series connection of two semiconductor switches 2, which are arranged in a series connection. In this context, the semiconductor switches 2 have a switching element 21 that is able to conduct and switch off a current in one direction. Diode 22, which is able to conduct a current in the opposite direction but cannot switch it off, is arranged parallel to said switching element 21. The diode 22 is thus arranged antiparallel to the switching element 21. In this context, the semiconductor switches 2 are arranged in an antiserial manner. Antiserial means that it is possible to switch off a current in one direction by way of the electronic switch 7, by means of one of the two semiconductor switches 2, and it is possible to switch off a current in the opposite direction by way of the other of the two semiconductor switches 2.

Figure 2:
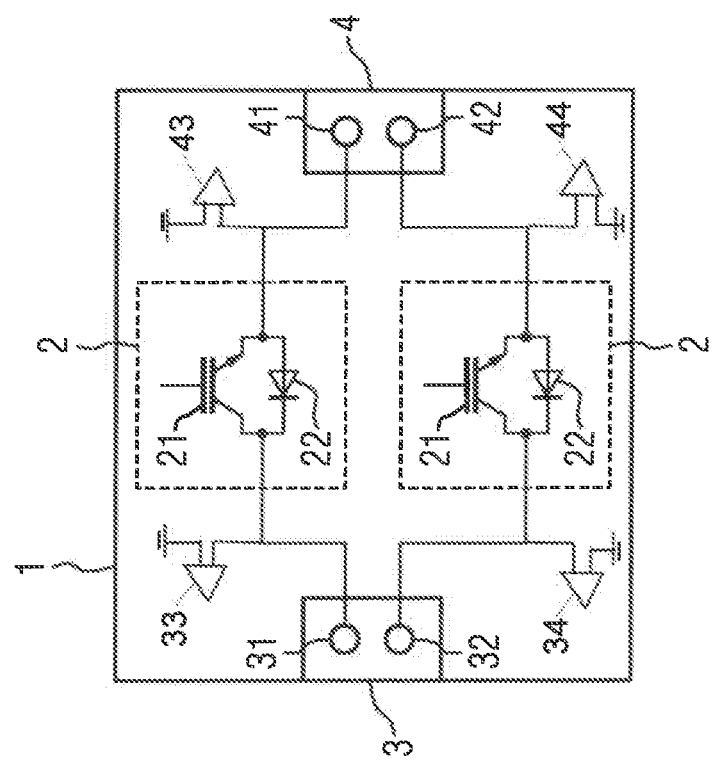
FIG. 2 shows an electronic protection switch.

FIG. 2 shows an electronic protection switch 1. This has two semiconductor switches 2, in which the diode 22 is arranged antiparallel to the switching element 21 in each case. In contrast to the electronic switch 7 already known, this has a total of four phase terminals 31, 32, 41, 42. Two of these phase terminals 31, 32 form the first network terminal 3; a further two of these phase terminals 41, 42 form the second network terminal 4. The two feeds, to which the DC voltage is applied during use in a DC voltage network 6, are connected both at the first and at the second network terminal 3, 4. The phase terminals 31, 32, 41, 42 at the first network terminal 3 and at the second network terminal thus each have a positive potential and a negative potential of said DC voltage. In order to be able to distinguish between the terminals of the network terminals in each case, these are referred to as positive potential terminal 31, 41 and as negative potential terminal 32, 42. This designation is also retained below when the electronic protection switch is used in an AC voltage network and a phase terminal and a neutral conductor terminal are involved.

The electronic protection switch 1 has a voltage detection 33, 34, 43, 44 for measuring a voltage between the positive potential terminal 31 and a ground potential and/or a voltage between the positive potential terminal 41 and the ground potential and/or a voltage between the negative potential terminal 32 and the ground potential and/or a voltage between the negative potential terminal 42 and the ground potential.

The semiconductor switches 2 are arranged in the feeds so as to interrupt an energy flow between the first network terminal 3 and second network terminal 4. This interruption may be ensured for both energy flow directions, as the same current flows between the positive potential terminal 31 of the first network terminal and the positive potential terminal 41 of the second network terminal 4 as between the negative potential terminal 32 of the first network terminal 3 and the negative potential terminal 42 of the second network terminal 4. In each case, the currents differ only in their direction. In this context, there is a forward current and return current from energy source to the load. In order to be able to interrupt the energy flow regardless of the energy flow direction, the current flows once through the switching element 21 and once through the diode 22. Thus, the current can be interrupted regardless of the energy flow direction.

In contrast to the use of two electronic switches 7 according to FIG. 1, only two times the forward losses of the semiconductor switch 2 are incurred for the electronic protection switch in the overall current circuit for forward current and return current, whereas four times as much is incurred when using two electronic switches 7. Thus, the electronic protection switch 1 may halve the losses compared to the known solution.

Due to the arrangement of the semiconductor switches 2, the first semiconductor switch is able to conduct and interrupt a current from the positive potential terminal 31 of the first network terminal 3 to the positive potential terminal 41 of the second network terminal 4, and the second semiconductor switch is able to conduct and interrupt a current from the negative potential terminal 32 of the first network terminal 3 to the negative potential terminal 42 of the second network terminal 4. A current between the two energy subnetworks can therefore be interrupted regardless of the energy flow direction.

Figure 3:
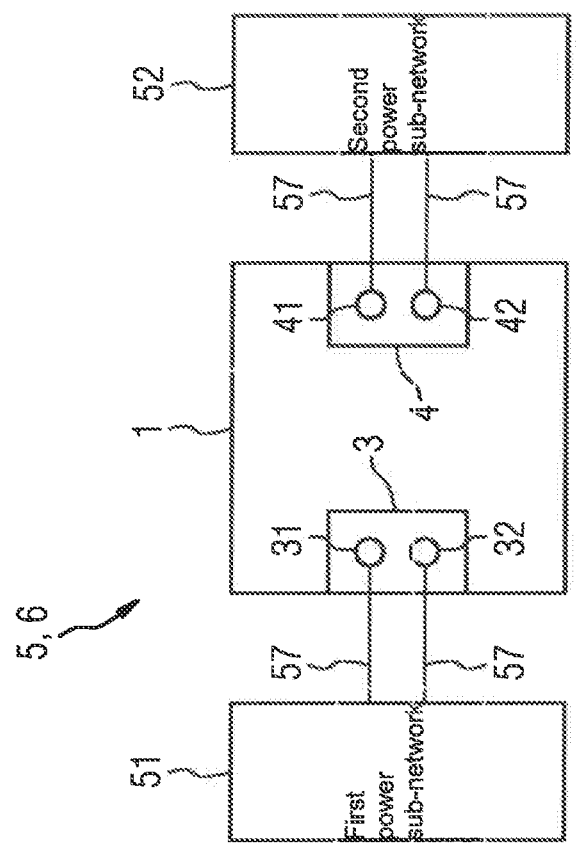
FIG. 3 shows a DC voltage system.

FIG. 3 shows an energy network 5. Due to the two feeds between, this may involve a DC voltage network 6, for example. As an alternative, the embodiment of an AC voltage network is also possible. In general, this energy network 5 has a first energy subnetwork 51 and a second energy subnetwork 52. These are interconnected via two feeds 57, wherein the electronic protection switch 1 is introduced into these feeds 57 in order to be able to disconnect or interconnect the two subnetworks. In this context, the energy subnetworks 51,52 may have one or more energy sources (not shown in further detail) and/or one or more loads (not shown in further detail), such as electrical consumers. In this context, it is possible for the energy subnetworks to have a combination of energy sources and loads. In the simplest case, the one energy subnetwork 51 involves an energy source, which is embodied as a DC voltage source, and the second energy subnetwork involves a load, which is supplied with a DC voltage. With the aid of the electronic protection switch 1, it is possible to interrupt an energy flow between the two subnetworks regardless of the energy flow direction. Moreover, with this arrangement, it is possible to identify and locate an occurring fault, in particular a ground fault, by measuring and evaluating the voltage applied at the respective potentials 31, 32, 41, 42 compared to the ground potential. This is particularly advantageous for the application in a DC voltage network designed in an isolated manner.

In summary, the invention relates to an electronic protection switch, having two semiconductor switches, each with a switching element and a diode arranged antiparallel to the switching element. To improve the electronic switch, in particular with regard to the losses incurred during operation and with regard to locating faults, it is proposed that the electronic switch furthermore has a first network terminal and a second network terminal, each with a positive potential terminal and a negative potential terminal, wherein a first of the semiconductor switches is arranged without a semiconductor series connection between the positive potential terminal of the first network terminal and the positive potential terminal of the second network terminal and a second of the semiconductor switches is arranged without a semiconductor series connection between the negative potential terminal of the first network terminal and the negative potential terminal of the second network terminal, wherein the switching element of the respective semiconductor switch is arranged so as to be able to conduct and switch off a current from the first network terminal to the second network terminal. The invention further relates to an energy network, in particular a DC voltage network, with a first energy subnetwork and a second energy subnetwork, wherein the energy network has an electronic protection switch of this kind for disconnecting the first energy subnetwork and the second energy subnetwork from one another, wherein the first energy subnetwork is connected to the first network terminal and the second energy subnetwork is connected to the second network terminal. Furthermore, the invention relates to a method for operating an energy network of this kind.

What is claimed is:
1. An electronic protection switch, comprising:
a first network terminal including a first positive potential terminal and a first negative potential terminal;
a second network terminal including a second positive potential terminal and a second negative potential terminal;
a first switching element formed by an IGBT semiconductor switch and a first diode connected antiparallel to the first switching element, said first switching element connected directly, without an additional intervening semiconductor element, between the first positive potential terminal and the second positive potential terminal;

a second switching element formed by an IGBT semiconductor switch and a second diode connected antiparallel to the second switching element, said second switching element connected directly, without an additional intervening semiconductor element, between the first negative potential terminal and the second negative potential terminal, and with the switching element of each of the two semiconductor switches being arranged so as to be able to conduct and switch off a current from the first network terminal to the second network terminal.

2. The electronic protection switch of claim 1, consisting of exactly one first semiconductor switch and exactly one second semiconductor switch configured for switching the current between the first and second network terminals in an AC voltage network, with the first positive potential terminal connected to a phase and the first negative potential terminal connected to ground.

3. The electronic protection switch of claim 1, further comprising a voltage detection configured to measure a voltage between a ground potential and at least one of the first positive potential terminal of the first network terminal, the first negative potential terminal of the first network terminal, the second positive potential terminal of the second network terminal and the second negative potential terminal of the second network terminal.

4. The electronic protection switch of claim 1, wherein the first and the second two semiconductor switches each have a design based on an NPN-type transistor.

5. An energy network, comprising:
a first energy subnetwork;
a second energy subnetwork; and
an electronic protection switch configured to disconnect the first energy subnetwork and the second energy subnetwork from one another, said electronic protection switch comprising:
a first network terminal Including a first positive potential terminal and a first negative potential terminal;
a second network terminal including a second positive potential terminal and a second negative potential terminal;
a first switching element formed by an IGBT semiconductor switch and a first diode connected antiparallel to the first switching element, said first switching element connected directly, without an additional intervening semiconductor element, between the first positive potential terminal and the second positive potential terminal;

a second switching element formed by an IGBT semiconductor switch and a second diode connected antiparallel to the second switching element, said second switching element connected directly, without an additional intervening semiconductor element, between the first negative potential terminal and the second negative potential terminal.

6. The energy network of claim 5, embodied as a DC voltage network.

7. The energy network of claim 5, wherein the first and second energy subnetworks include at least one inductive load.

8. The energy network of claim 5, consisting of exactly one first semiconductor switch and exactly one second semiconductor switch configured for switching the current between the first and second network terminals in an AC voltage network, with the first positive potential terminal connected to a phase and the first negative potential terminal connected to ground.

9. The energy network of claim 5, wherein the electronic protection switch includes a voltage detection configured to measure a voltage between a ground potential and at least one of the first positive potential terminal of the first network terminal, the first negative potential terminal of the first network terminal, the second positive potential terminal of the second network terminal and the second negative potential terminal of the second network terminal.

10. The energy network of claim 5, wherein the two semiconductor switches of the electronic protection switch each have a design based on an NPN-type transistor.

11. A method for operating an energy network as set forth in claim 5, comprising:
opening the electronic protection switch when a ground fault occurs in the energy network.

12. The method of claim 11, further comprising ascertaining a location of the ground fault by measuring a voltage between a ground potential and at least one of the first positive potential terminal of the first network terminal, the first negative potential terminal of the first network terminal, the second positive potential terminal of the second network terminal and the second negative potential terminal of the second network terminal.

* * * * *